United States Patent
Ito et al.

(10) Patent No.: US 12,107,033 B2
(45) Date of Patent: Oct. 1, 2024

(54) COOLING STRUCTURE AND ELECTRICAL APPARATUS

(71) Applicants: KABUSHIKI KAISHA TOYOTA JIDOSHOKKI, Kariya (JP); NIDEC CORPORATION, Kariya (JP)

(72) Inventors: Toshiaki Ito, Kariya (JP); Takashi Takeuchi, Kariya (JP); Yoshiaki Oshita, Kariya (JP); Hidehiko Hidaka, Kyoto (JP); Shigeyuki Moriya, Kyoto (JP)

(73) Assignees: KABUSHIKI KAISHA TOYOTA JIDOSHOKKI, Kariya (JP); NIDEC CORPORATION, Kyoto (JP)

( * ) Notice: Subject to any disclaimer, the term of this patent is extended or adjusted under 35 U.S.C. 154(b) by 298 days.

(21) Appl. No.: 17/789,030

(22) PCT Filed: Dec. 21, 2020

(86) PCT No.: PCT/JP2020/047705
§ 371 (c)(1),
(2) Date: Jun. 24, 2022

(87) PCT Pub. No.: WO2021/132165
PCT Pub. Date: Jul. 1, 2021

(65) Prior Publication Data
US 2023/0076448 A1    Mar. 9, 2023

(30) Foreign Application Priority Data
Dec. 26, 2019   (JP) .................................. 2019-236323

(51) Int. Cl.
*H01L 23/467*   (2006.01)
*H01L 23/473*   (2006.01)

(52) U.S. Cl.
CPC .......... *H01L 23/467* (2013.01); *H01L 23/473* (2013.01)

(58) Field of Classification Search
CPC ........................... H01L 23/467; H01L 23/473
(Continued)

(56) References Cited

U.S. PATENT DOCUMENTS 5,288,203 A * 2/1994 Thomas ................ H01L 23/467
                                                            415/214.1
5,484,013 A * 1/1996 Morikawa ............. H01L 23/467
                                                             165/122

(Continued)

FOREIGN PATENT DOCUMENTS

EP    2 675 054 A1   12/2013
JP    9-51189 A       2/1997
(Continued)

OTHER PUBLICATIONS

International Search Report for PCT/JP2020/047705 dated, Mar. 9, 2021 (PCT/ISA/210).

*Primary Examiner* — Jon T. Schermerhorn, Jr.
(74) *Attorney, Agent, or Firm* — Sughrue Mion, PLLC

(57) ABSTRACT

A cooling structure includes: a main body receiving heat from a heat source and releasing the heat through a heat dissipation surface and a plurality of heat dissipation fins; a lid member having an air inlet and a fastened portion fastened to the main body; and a fan mechanism. The lid member is disposed to cover a plurality of heat dissipation fins from a side of respective top ends and thereby form a flow path. The fan mechanism has a fan main body that generates airflow, and a seating that holds the fan main body and attaches the fan main body to the lid member. The seating is subjected to an urging force applied from the main body to the seating, or fastened to the main body by a (Continued)

fastener. The cooling structure has a configuration that can suppress generation of vibration of the lid member forming the flow path.

8 Claims, 4 Drawing Sheets

(58) Field of Classification Search
USPC .......................................................... 165/80.3
See application file for complete search history.

(56) References Cited

U.S. PATENT DOCUMENTS

| | | | | |
|---|---|---|---|---|
| 5,526,875 | A * | 6/1996 | Lin | H01L 23/467 |
| | | | | 165/122 |
| 5,810,554 | A | 9/1998 | Yokozawa et al. | |
| 6,348,748 | B1 * | 2/2002 | Yamamoto | F04D 29/424 |
| | | | | 310/67 R |
| 6,401,808 | B1 * | 6/2002 | Hanzlik | F04D 29/685 |
| | | | | 257/E23.099 |
| 6,442,025 | B2 * | 8/2002 | Nakamura | G06F 1/203 |
| | | | | 165/104.33 |
| 6,519,149 | B1 * | 2/2003 | Inoue | H05K 7/20172 |
| | | | | 361/689 |
| 6,567,269 | B2 * | 5/2003 | Homer | G06F 1/203 |
| | | | | 174/16.3 |
| D480,468 | S * | 10/2003 | Hoshina | D23/411 |
| 7,333,340 | B2 * | 2/2008 | Zhang | F28D 15/0233 |
| | | | | 361/719 |
| 7,336,488 | B2 * | 2/2008 | Inoue | G06F 1/203 |
| | | | | 174/15.2 |
| 7,365,989 | B2 * | 4/2008 | Peng | H01L 23/427 |
| | | | | 361/720 |
| 7,414,846 | B2 * | 8/2008 | Cheng | G06F 1/20 |
| | | | | 361/679.48 |
| 7,474,533 | B2 * | 1/2009 | Tanaka | G06F 1/203 |
| | | | | 361/695 |
| 8,672,615 | B2 * | 3/2014 | Ruckert | F04D 25/0613 |
| | | | | 415/214.1 |
| 10,462,930 | B2 * | 10/2019 | Lin | H05K 7/20172 |
| 10,771,659 | B2 * | 9/2020 | Arai | G03B 17/55 |
| 2014/0055671 | A1 | 2/2014 | Kawamura | |

FOREIGN PATENT DOCUMENTS

| | | |
|---|---|---|
| JP | 10-111039 A | 4/1998 |
| JP | 10-145079 A | 5/1998 |
| JP | 10-326986 A | 12/1998 |
| JP | 2001-326488 A | 11/2001 |
| JP | 2012-164878 A | 8/2012 |
| JP | 2014-45345 A | 3/2014 |
| JP | 2017-68475 A | 9/2017 |
| JP | 2017-168475 A | 9/2017 |
| KR | 10-2016-0116255 A | 10/2016 |

* cited by examiner

COOLING STRUCTURE AND ELECTRICAL APPARATUS

CROSS REFERENCE TO RELATED APPLICATIONS

This application is a National Stage of International Application No. PCT/JP2020/047705 filed Dec. 21, 2020, claiming priority based on Japanese Patent Application No. 2019-236323 filed Dec. 26, 2019.

TECHNICAL FIELD

The present description relates to a cooling structure and an electrical apparatus.

BACKGROUND ART

As disclosed in Japanese Patent Laying-Open No. H10-145079 (PTL 1), an electrical apparatus has various devices (heat sources) contained in a case. The case is equipped with a cooling structure for the purpose of dissipating heat. The cooling structure includes a plurality of heat dissipation fins and a fan mechanism for promoting dissipation of heat by these heat dissipation fins.

CITATION LIST

Patent Literature

PTL 1: Japanese Patent Laying-Open No. H10-145079

SUMMARY

Technical Problem

The cooling structure further includes a lid member. The lid member is disposed to cover a plurality of heat dissipation fins and thereby form a tunnel-shaped flow path between the fins and the lid member. The fan mechanism is driven to cause refrigerant such as air to flow in the flow path and thereby promote dissipation of heat by the heat dissipation fins. The fan mechanism may be fixed to the lid member that forms the flow path, rather than to the main body in which a plurality of fins are arranged. In such a case, rotation of the fan is likely to cause the lid member to vibrate, and thus likely to cause noise or the like due to the vibration of the lid member.

The present description aims to disclose a cooling structure having a configuration that can suppress generation of vibration of the lid member forming the flow path, as well as an electrical apparatus having such a cooling structure.

Solution to Problem

A cooling structure based on the present disclosure includes: a main body that includes a heat dissipation surface, and a plurality of heat dissipation fins each protruding from the heat dissipation surface and extending in a height direction from a bottom end located on a side of the heat dissipation surface toward a top end, and releases, through the heat dissipation surface and the plurality of heat dissipation fins, heat received from a heat source; a lid member including an air inlet, and a fastened portion fastened to the main body; and a fan mechanism fixed to the lid member. The lid member is disposed to cover the plurality of heat dissipation fins from a side of the top end to form a flow path together with the heat dissipation surface and the plurality of heat dissipation fins. The fan mechanism includes a fan main body that is driven to rotate and thereby generate an airflow with its upstream side at the air inlet and its downstream side at the flow path, and a seating that holds the fan main body and attaches the fan main body to the lid member. The seating is subjected to an urging force applied from the main body to the seating, or fastened to the main body by a fastener.

An electrical apparatus based on the present disclosure includes a case and a heat source contained in the case, and the case is equipped with the above-described cooling structure based on the present disclosure.

Advantageous Effects

With the configuration disclosed herein, a cooling structure having a configuration that can suppress generation of vibration of the lid member forming a flow path, as well as an electrical apparatus equipped with such a cooling structure can be obtained.

DESCRIPTION OF EMBODIMENTS

Figure 1:
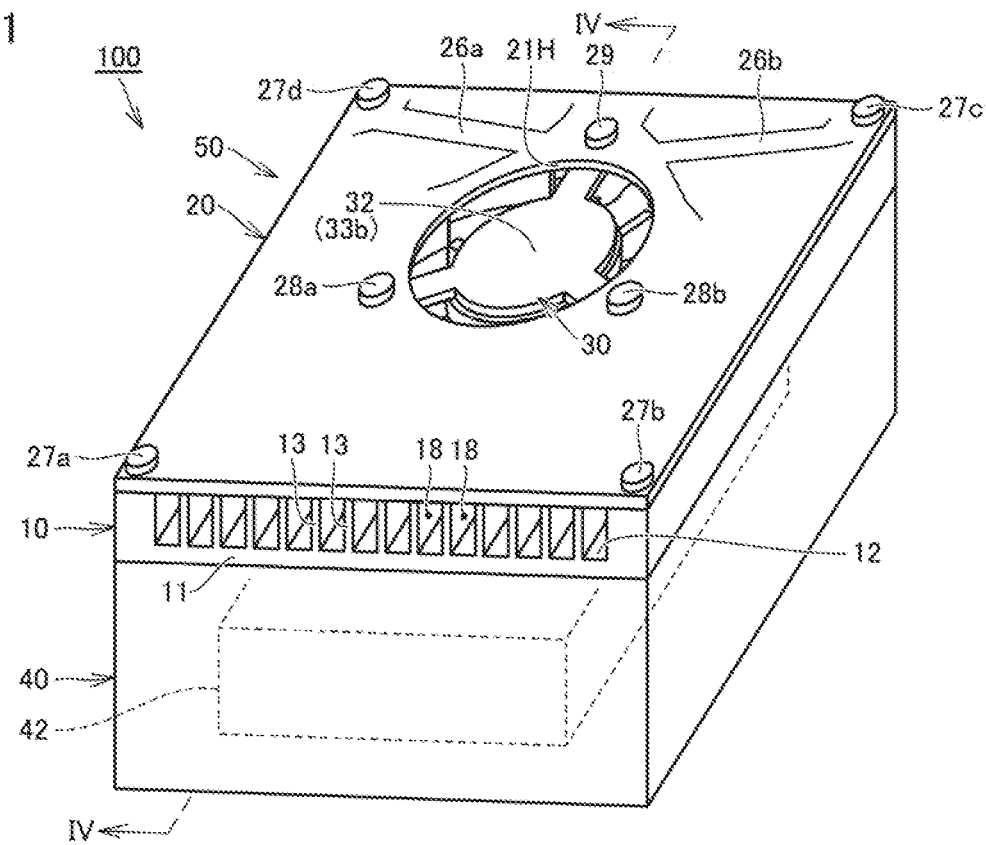
FIG. 1 is a perspective view showing an electrical apparatus 100 equipped with a cooling structure 50 according to Embodiment 1.

Embodiments of the present disclosure are described hereinafter with reference to the drawings. In the following description, the same parts and corresponding parts are denoted by the same reference numerals, and a description of the same or corresponding parts may not be repeated.

Embodiment 1

Electrical Apparatus 100

FIG. 1 is a perspective view showing an electrical apparatus 100 having a cooling structure 50. The electrical apparatus 100 includes a case 40 and a heat source 42 contained in the case 40. The heat source 42 is made up of various devices, and operates to generate heat. The case 40 is equipped with the cooling structure 50 for the purpose of heat dissipation.

Cooling Structure 50

Figure 2:
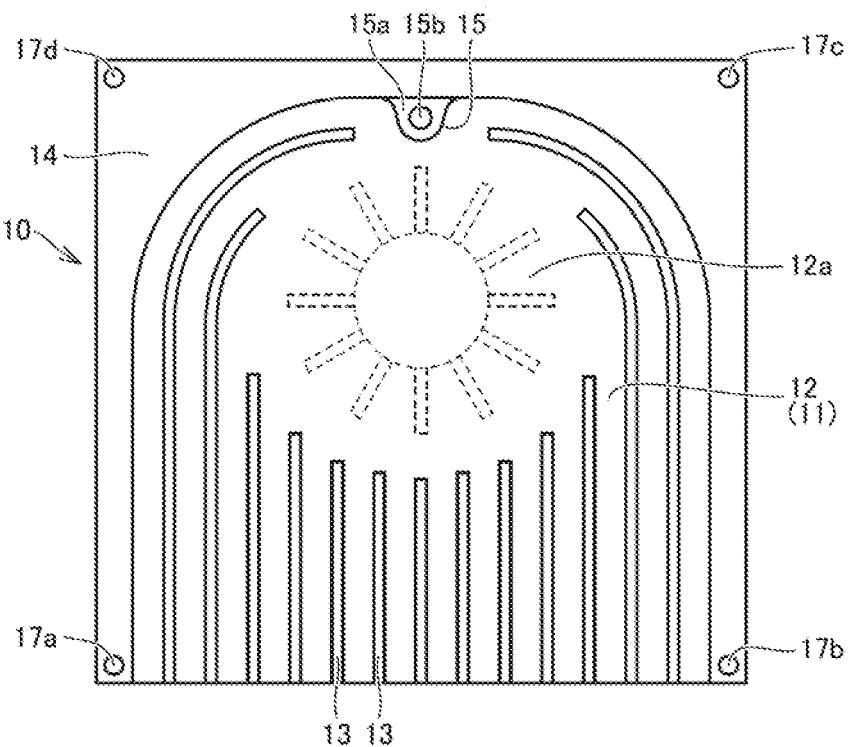
FIG. 2 is a plan view showing a main body 10 of the cooling structure 50 according to Embodiment 1.
Figure 3:
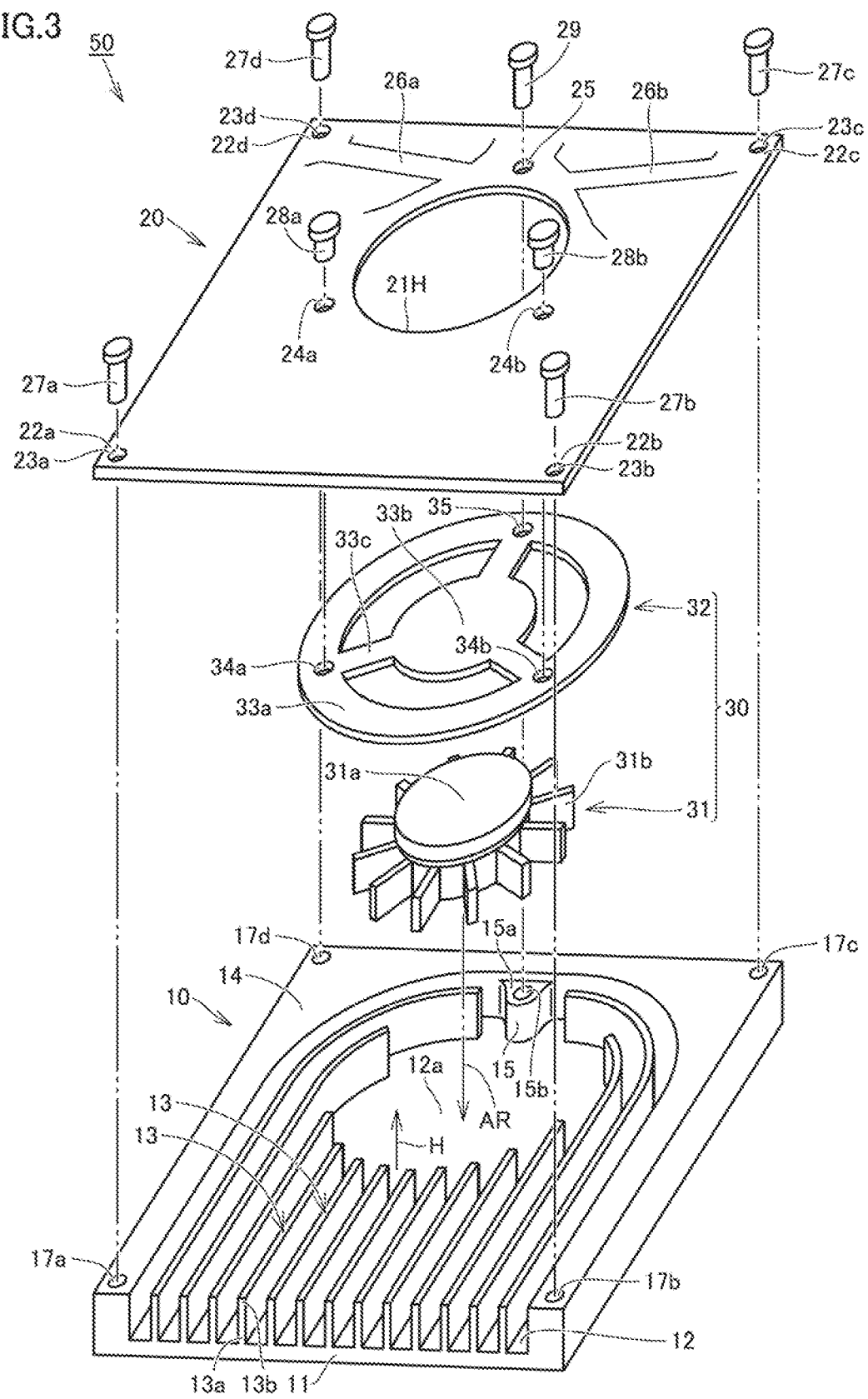
FIG. 3 is a perspective view showing the cooling structure 50 in an exploded state according to Embodiment 1.
Figure 4:
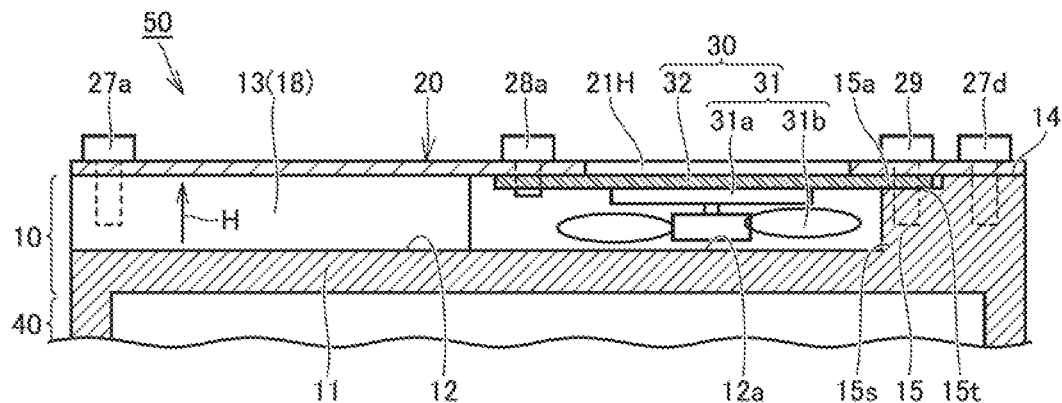
FIG. 4 is a cross-sectional view along a line Iv-Iv in FIG. 1 as seen in the direction of the arrow, showing a cross-sectional structure of the cooling structure 50 according to Embodiment 1.

FIG. 2 is a plan view showing a main body 10 of the cooling structure 50. FIG. 3 is a perspective view showing the cooling structure 50 in an exploded state. FIG. 4 is a cross-sectional view along a line Iv-Iv in FIG. 1 as seen in the direction of the arrow, showing a cross-sectional structure of the cooling structure 50. As shown in FIGS. 1 to 4 (mainly FIG. 3), the cooling structure 50 includes the main body 10, a lid member 20, and a fan mechanism 30.

Main Body 10

The main body 10 includes a base 11 in a flat plate shape, and a plurality of heat dissipation fins 13 arranged to stand upright on the base 11. A surface of the base 11 (a surface of the base 11 located at an end in the thickness direction of the base 11) forms a heat dissipation surface 12 (FIG. 4). A plurality of heat dissipation fins 13 protrude from the heat dissipation surface 12, and extend, in the height direction H (FIG. 3), from a bottom end 13a (FIG. 3) located on a side of the heat dissipation surface 12 toward a top end 13b. The height direction H is herein also the thickness direction of the base 11.

On the base 11, a relatively large part extending substantially in a U shape as seen in plan view is also disposed along three sides of the base 11. An inner surface in the U shape formed on this part also forms a flow path 18 described later herein, and therefore, this part may also serve as a heat dissipation fin 13.

The heat dissipation surface 12 includes a flat region 12a in which a plurality of heat dissipation fins 13 are not located, and these heat dissipation fins 13 are disposed to partially or entirely surround the periphery of the flat region 12a (see FIG. 2). "A flat region 12a in which a plurality of heat dissipation fins 13 are not located" herein does not include the lower surface of flow paths separated from each other by these elongate heat dissipation fins 13. As seen in plan view, the flat region 12a has a surface area larger than that of the lower surface (the surface formed by the heat dissipation surface 12) of the flow paths separated from each other by these heat dissipation fins 13, and larger than that of a fan main body 31 of the fan mechanism 30 described later herein.

Four screw holes 17a to 17d are located in an upper surface 14 of the main body 10. The upper surface 14 is a surface of the U-shaped part (heat dissipation fins 13) disposed upright along the outer peripheral edge of the base 11, and the upper surface 14 is opposite to the base 11. The upper surface 14 is a surface extending in a direction crossing the direction from the bottom end 13a toward the top end 13b of the heat dissipation fin 13, and forms the top end 13b. It is not indispensable that the screw holes 17a to 17d be located in a part of the main body 10 that serves as a heat dissipation fin. The screw holes 17a to 17d may be located in any position in the main body 10, and the screw holes 17a to 17d may be located in a part that does not serve as a heat dissipation fin.

The main body 10 further includes a boss 15 protruding in the height direction H from the heat dissipation surface 12. Like the heat dissipation fin 13, the boss 15 protrudes from the heat dissipation surface 12 and extends in the height direction H from a bottom end 15s (FIG. 4) located on a side of the heat dissipation surface 12 toward a top end 15t. To the boss 15, a seating 32 described later herein is fastened. The boss 15 has an upper end surface 15a (specifically a surface extending in a direction crossing the direction from the bottom end 15s toward the top end 15t of the boss 15 and forming the top end 15θ is located at a position lower than the position of the upper surface 14 in the height direction H. A screw hole 15b is located in the upper end surface 15a.

Heat generated from the heat source 42 (FIG. 1) in the case 40 is transferred to the base 11. The main body 10 receives the heat from the heat source 42 through the base 11, and releases the heat through the heat dissipation surface 12 and a plurality of heat dissipation fins 13. The main body 10 and the case 40 may be formed as separate parts and the main body 10 may be attached to the case 40. The main body 10 may also be formed integrally with the case 40 in advance, as one of constituent parts of the case 40.

Lid Member 20

The lid member 20 has a flat plate shape, and has fastened portions 22a to 22d that are fastened to the main body 10. The lid member 20 is disposed to cover a plurality of heat dissipation fins 13 from a side of the top end 13b, and thus the lid member 20 forms a plurality of flow paths 18 (FIG. 1) together with the heat dissipation surface 12 and a plurality of heat dissipation fins 13.

The fastened portions 22a to 22d are located at the outer peripheral edge of the lid member 20. The fastened portions 22a to 22d in the present embodiment are located at respective positions of the four corners of the lid member 20. At respective four corner positions of the lid member 20, through holes 23a to 23d are formed. The lid member 20 is disposed on the main body 10, so that the through holes 23a to 23d communicate respectively with the screw holes 17a to 17d of the main body 10. Note that the number "four" (four corners) is given herein by way of example, and the number may be any that is more than one, such as three or five. The outer shape of the lid member 20 is not limited to a rectangular shape, but may be any shape such as polygonal shape, elliptical shape, or circular shape.

Fasteners 27a to 27d inserted respectively in the through holes 23a to 23d are screwed respectively into screw holes 17a to 17d of the main body 10, and thus the lid member 20 is fastened to the main body 10 by the fasteners 27a to 27d (FIG. 1). In the present embodiment, respective peripheral portions of the through holes 23a to 23d in lid member 20 are fastened to the main body 10 by the fasteners 27a to 27d, and the peripheral portions of the through holes 23a to 23d in the lid member 20 correspond to the fastened portions 22a to 22d.

An air inlet 21H is formed substantially at the center of the lid member 20 to extend through the lid member 20. Around the air inlet 21H, through holes 24a, 24b, and 25 are formed in the lid member 20. Fasteners 28a, 28b, and 29 are inserted respectively in the through holes 24a, 24b, and 25, and the fasteners 28a, 28b, and 29 are used to fasten the seating 32 of a fan mechanism 30 to the lid member 20, of which details are given later herein.

Reinforcing ribs 26a, 26b are formed in the lid member 20. The reinforcing ribs 26a, 26b each extend from a position located on a side of the seating 32 (namely from the position where the seating 32 is attached to the lid member 20) toward a position on a side of a corresponding one of the fastened portions 22c, 22d. The reinforcing ribs 26a, 26b are formed by pressing the lid member 20, for example, to increase the rigidity of the lid member 20.

Fan Mechanism 30

The fan mechanism 30 has the fan main body 31 and the seating 32, and is fastened to the lid member 20. In the state where the lid member 20 is fastened to the main body 10, the fan main body 31 is disposed to face the flat region 12a of the heat dissipation surface 12 (see an arrow AR in FIG. 3). In the height direction H (FIG. 4), The fan main body 31 is disposed between the lid member 20 and the heat dissipation surface 12. The periphery of the fan main body 31 (particularly a vane portion 31b described in the following) is surrounded by a plurality of heat dissipation fins 13.

The fan main body 31 includes a driving portion 31a and the vane portion 31b, and the vane portion 31b is driven to rotate and thereby generate an airflow with its upstream side at the air inlet 21H (FIG. 1) and its downstream side at the flow paths 18 (FIG. 1). The fan main body 31 may be configured as a centrifugal fan or the like (sirocco fan or turbo fan, for example) that is capable of sucking air through the air inlet 21H, in the direction of the rotational axis of the vane portion 31b, and efficiently discharging the air outward in the rotational radius direction (toward the side where a plurality of heat dissipation fins 13 are arranged).

The seating 32 is formed of a thin plate-like member, holds the fan main body 31, and attaches the fan main body 31 to the lid member 20. The seating 32 includes an annular outer peripheral portion 33a, a central portion 33b disposed inside the outer peripheral portion 33a, and three connecting portions 33c. The three connecting portions 33c extend in the radial direction from the central portion 33b and connect the central portion 33b to the outer peripheral portion 33a. Note that the number "three" is given herein by way of example, and the number may be any such as two or four. The driving portion 31a of the fan main body 31 is fastened to the central portion 33b.

In the outer peripheral portion 33a of the seating 32, screw holes 34a, 34b and a through hole 35 are formed. The fasteners 28a, 28b are inserted respectively in the through holes 24a, 24b of the lid member 20, and screwed respectively into the screw holes 34a, 34b of the seating 32. The fastener 29 is inserted in the through hole 25 of the lid member 20 and the through hole 35 of the seating 32, and screwed into the screw hole 15b of the main body 10 (boss 15). The seating 32 is fastened to the lid member 20 by the fasteners 28a, 28b. The seating 32 is further fastened to the boss 15 of the main body 10 by the fastener 29. The fastener 29 fastens the lid member 20 and the seating 32 together to the boss 15. The seating 32 is held between the lid member 20 and the upper end surface 15a of the boss 15.

Functions and Effects

According to the present embodiment, the fan mechanism 30 is fastened to the lid member 20 that forms the flow paths 18 (FIG. 1). In contrast, the fan mechanism 30 may be fastened to the main body 10, for example. In such a case, the fan main body 31 is held stably by the main body 10, and therefore, even when the fan main body 31 is driven to rotate, the effect of the rotation is hardly transferred to the lid member 20 and noise or the like due to vibration of the lid member 20 is hardly generated. In contrast, when the fan mechanism 30 is fastened to the lid member 20, rotation of the vane portion 31b is likely to cause vibration of the lid member 20 and thus likely to cause noise or the like due to the vibration of the lid member 20.

Figure 5:
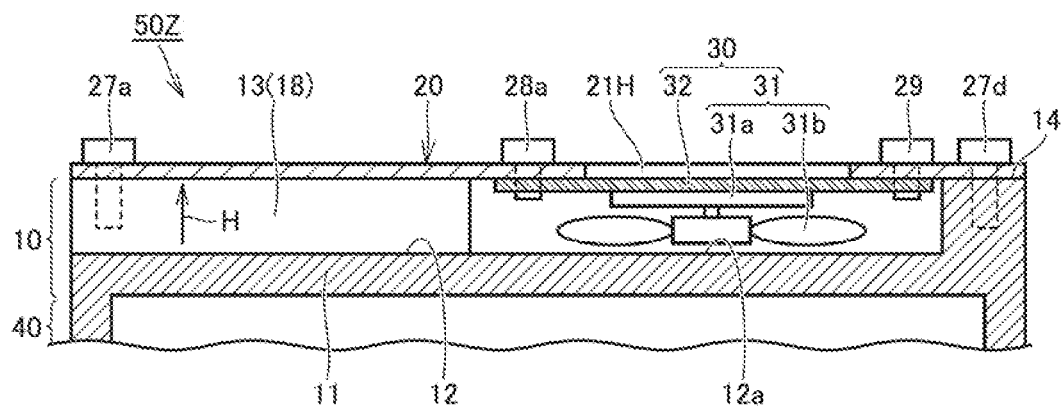
FIG. 5 shows a cross-sectional structure of a cooling structure 50Z according to a comparative example.

FIG. 5 shows a cross-sectional structure of a cooling structure 50Z according to a comparative example. For the cooling structure 50Z, the structure of Embodiment 1 (cooling structure 50) in which the seating 32 of the fan main body 31 is fastened to the main body 10 (boss 15) by the fastener 29 is not employed. Therefore, in the state where respective positions of the fastened portions 22a to 22d (see FIG. 3) each form a fixed end while the position of the seating 32 forms a free end, the fan mechanism 30 is held like a cantilever (floating with respect to the main body 10), which generates a situation where vibration is likely to occur.

As set forth above, in the cooling structure 50 according to Embodiment 1, the seating 32 of the fan main body 31 is fastened to the main body 10 (boss 15) by the fastener 29. Respective positions of the fastened portions 22a to 22d (see FIG. 3) each form a fixed end and a portion of the seating 32 that is connected to the boss 15 also forms a fixed end. The fan mechanism 30 is held nearly in the state of being supported at its opposite ends, and therefore, even when the vane portion 31b is driven to rotate, the lid member 20 is unlikely to vibrate and thus generation of noise or the like due to vibration of the lid member 20 is effectively suppressed.

Particularly in the cooling structure 50 according to Embodiment 1, the fastened portions 22a to 22d are each disposed at a position located outward away from the seating 32. If no measures are taken, this generates a situation where vibration is more likely to occur. In contrast, according to Embodiment 1, the portion of the seating 32 connected to the boss 15 also forms a fixed end, and accordingly, generation of noise or the like due to vibration of the lid member 20 is also effectively suppressed.

As set forth above, in the cooling structure 50, the reinforcing ribs 26a, 26b are formed in the lid member 20. The reinforcing ribs 26a, 26b each extend from a position located on a side of the seating 32 (from the position where the seating 32 is attached to the lid member 20) toward a position on a side of a corresponding one of the fastened portions 22c, 22d. The presence of the reinforcing ribs 26a, 26b increases the rigidity of the lid member 20, makes it less likely that the lid member 20 vibrates, and thus effectively suppresses generation of noise or the like due to vibration of the lid member 20.

As set forth above, in the cooling structure 50, the fan main body 31 is disposed to face the flat region 12a of the heat dissipation surface 12. While it is not indispensable to form the flat region 12a in the base 11 (heat dissipation surface 12), this configuration enables air or the like from the fan main body 31 to impinge against and move radially from the flat region 12a and thereby flow efficiently into the flow paths 18.

As set forth above, in the cooling structure 50, the fan main body 31 is disposed between the lid member 20 and the heat dissipation surface 12 in the height direction. While this configuration is not indispensable, employment of this configuration enables an arrangement in which a plurality of heat dissipation fins 13 surround the periphery of the fan main body 31 (vane portion 31b), for example, and thereby enables reduction of the thickness and the size, for example, of the cooling structure 50.

As set forth above, in the cooling structure 50, the main body 10 is provided with the boss 15, and the seating 32 of the fan main body 31 is fastened to the boss 15 by the fastener 29. While it is not indispensable to provide the main body 10 with the boss 15, the presence of the boss 15 easily and simply enables a configuration in which the seating 32 is fastened to the main body 10, i.e., the seating 32 is held between the lid member 20 and the upper end surface 15a of the boss 15 to form a fixed end. To fasten the seating 32 to the main body 10, a configuration may be employed in which a bracket or the like suspends from the seating 32 and the bracket is connected to any portion of the base 11 or the heat dissipation surface 12. This configuration also allows the portion of the seating 32 connected to the boss 15 to form a fixed end, and thus generation of noise or the like due to vibration of the lid member 20 is effectively suppressed.

As set forth above, in the cooling structure 50, the fastener 29 fastens the lid member 20 and the seating 32 together to the boss 15. Both the configuration in which the lid member 20 is fastened to the boss 15 by a single fastener 29 and the configuration in which the seating 32 is fastened to the boss 15 can thus be implemented.

Embodiment 2

Figure 6:
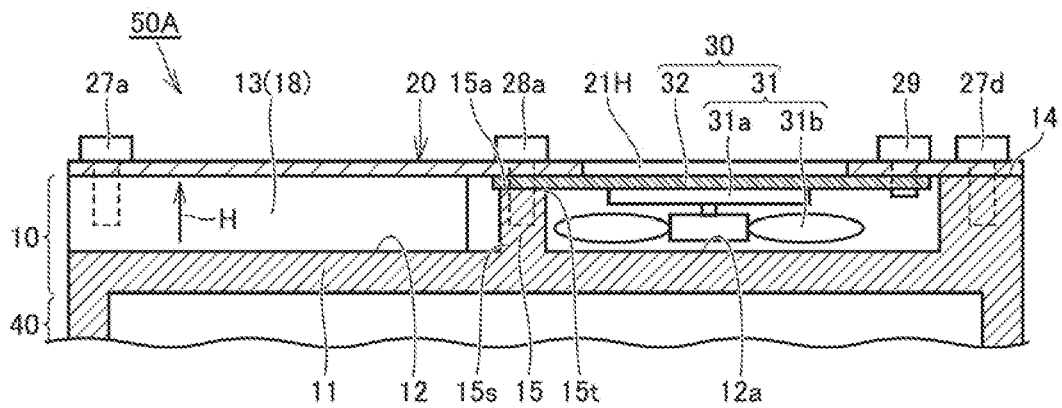
FIG. 6 is a cross-sectional view showing a cooling structure 50A according to Embodiment 2.

FIG. 6 is a cross-sectional view showing a cooling structure 50A according to Embodiment 2. The cooling structure 50A differs from Embodiment 1 (cooling structure 50) in terms of the position of the boss 15. As shown in FIG. 6, the boss 15 may be located closer to the center of the base 11. In the present embodiment, the fastener 28a serves as a fastener.

In the lid member 20, a portion further from the fastened portions 22a to 22d (see FIG. 3) may have a larger amplitude of vibration. The boss 15 is located closer to the center of the base 11 (lid member 20), and accordingly, the portion of the seating 32 fixed to the boss 15 forms a fixed end, which effectively suppresses generation of noise or the like due to vibration of the lid member 20. It is also effective to employ both the boss 15 shown in FIG. 4 and the boss 15 shown in FIG. 6.

Figure 7:
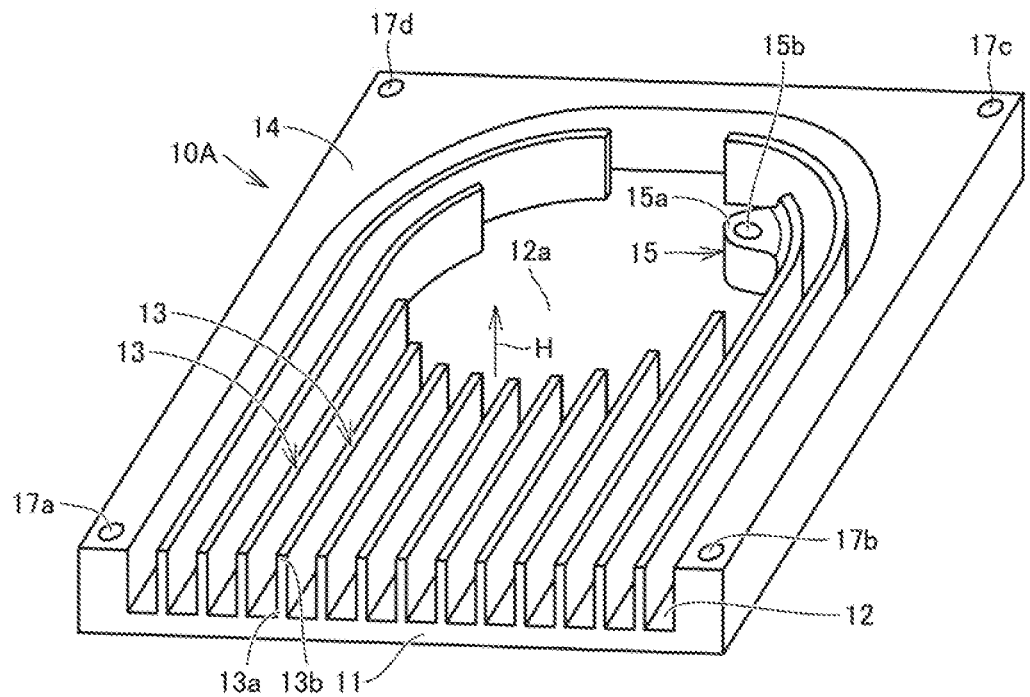
FIG. 7 is a perspective view showing a main body 10A of a cooling structure according to a modification of Embodiment 2.

Modification FIG. 7 is a perspective view showing a main body 10A of a cooling structure according to a modification of Embodiment 2. The boss 15 may be formed integrally with at least one of a plurality of heat dissipation fins 13. The shape, the size, and the arrangement of each of a plurality of heat dissipation fins 13, the fan main body 31, and the boss 15 may be optimized, so that air flows more efficiently and the heat exchange efficiency is enhanced. It may also be effective to employ the configuration of this modification for the sake of reducing the size and the thickness.

Embodiment 3

Figure 8:
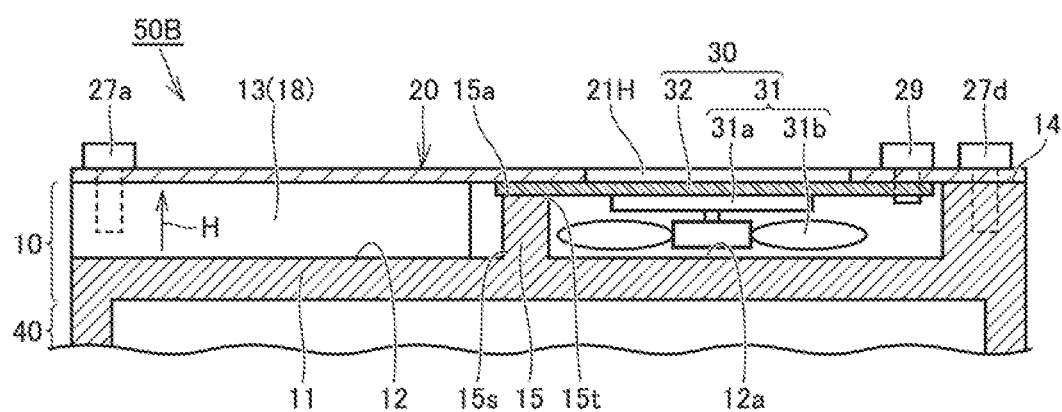
FIG. 8 is a cross-sectional view showing a cooling structure 50B according to Embodiment 3.

FIG. 8 is a cross-sectional view showing a cooling structure 50B according to Embodiment 3. In each of the above-described embodiments, the seating 32 of the fan main body 31 is fastened to the main body 10 by the fastener 29 (fastener 28a). The fastened portion may be implemented through fastening with a bolt, or fastening by means of an adhesive or welding, or implemented by a crimped structure or the like. In other words, a portion of the lid member that is fastened to the main body is a fastened portion. The fastened portion implemented by such a fastener 29, however, is not indispensable, and the seating 32 of the fan main body 31 may be incorporated in the cooling structure in such a manner that the seating 32 is subjected to an urging force applied from the main body 10 to the seating 32, as shown in FIG. 8, for example.

The height of the boss 15 is made larger than that of Embodiment 2 (FIG. 6), for example. This configuration allows the seating 32 to be held between the lid member 20 and the upper end surface 15a of the boss 15 even in the absence of the fastener 28a (FIG. 6), and allows the fan mechanism 30 to be held in the state of being supported at its opposite ends. Therefore, even when the vane portion 31b is driven to rotate, the lid member 20 is unlikely to vibrate and thus generation of noise or the like due to vibration of the lid member 20 is effectively suppressed. The fastener 28a is not used, which enables reduction of the number of parts.

While the embodiments are described hereinabove, the above disclosure is given by way of illustration in all respects, not by way of limitation. It is intended that the technical scope of the present disclosure is defined by claims, and encompasses all modifications and variations equivalent in meaning and scope to the claims.

REFERENCE SIGNS LIST 10, 10A main body; 11 base; 12 heat dissipation surface; 12a flat region; 13 heat dissipation fin; 13a, 15s bottom end; 13b, 15t top end; 14 upper surface; 15 boss; 15a upper end surface; 15b, 17a, 17d, 34a, 34b screw holes; 18 flow path; 20 lid member; 21H air inlet; 22a, 22c, 22d fastened portion; 23a, 23d, 24a, 24b, 25, 35 through hole; 26a, 26b reinforcing rib; 27a, 27d, 28a, 28b, 29 fastener; 30 fan mechanism; 31 fan main body; 31a driving portion; 31b vane portion; 32 seating; 33a outer peripheral portion; 33b central portion; 33c connecting portion; 40 case; 42 heat source; 50, 50A, 50B, 50Z cooling structure; 100 electrical apparatus; AR arrow; H height direction

The invention claimed is:

1. A cooling structure comprising:
    a main body that includes a heat dissipation surface, and
        a plurality of heat dissipation fins each protruding from the heat dissipation surface and extending in a height direction from a bottom end located on a side of the heat dissipation surface toward a top end, and releases, through the heat dissipation surface and the plurality of heat dissipation fins, heat received from a heat source;
    a lid member including an air inlet, and a fastened portion fastened to the main body; and
    a fan mechanism fixed to the lid member, wherein
    the lid member is disposed to cover the plurality of heat dissipation fins from a side of the top end to form a flow path together with the heat dissipation surface and the plurality of heat dissipation fins,
    the fan mechanism includes
        a fan main body that is driven to rotate and thereby generate an airflow with its upstream side at the air inlet and its downstream side at the flow path, and
        a seating that holds the fan main body and attaches the fan main body to the lid member,
    the seating is subjected to an urging force applied from the main body to the seating, or fastened to the main body by a fastener, and
    the fastened portion is disposed at a position located outward away from the seating.

2. The cooling structure according to claim 1, wherein
    the heat dissipation surface includes a flat region in which the plurality of heat dissipation fins are not located,
    the plurality of heat dissipation fins are disposed to partially or entirely surround a periphery of the flat region, and
    the fan main body is disposed to face the flat region.

3. The cooling structure according to claim 1, wherein
    the main body further includes a boss protruding from the heat dissipation surface, and
    the seating is fastened to the boss by the fastener.

4. The cooling structure according to claim 3, wherein the fastener fastens the lid member and the seating together to the boss.

5. The cooling structure according to claim 3, wherein the boss is formed integrally with at least one of the plurality of heat dissipation fins.

6. The cooling structure according to claim 1, wherein the fan main body is disposed between the lid member and the heat dissipation surface in the height direction.

7. The cooling structure according to claim 1, wherein
    the fastened portion is disposed at a position located outward away from the seating, and
    a reinforcing rib that extends from a position located on a side of the seating toward a position located on a side of the fastened portion is formed in the lid member.

8. An electrical apparatus comprising:
    a case; and
    a heat source contained in the case, wherein the case is equipped with the cooling structure according to claim 1.

* * * * *